United States Patent [19]

Mogi

[11] 3,839,681

[45] Oct. 1, 1974

[54] UNUSED CHANNEL SKIP SYSTEM

[75] Inventor: Takao Mogi, Tokyo, Japan

[73] Assignee: Sony Corporation, Tokyo, Japan

[22] Filed: Apr. 27, 1973

[21] Appl. No.: 355,209

[30] Foreign Application Priority Data

Apr. 27, 1972 Japan .............................. 47-42394

[52] U.S. Cl. ....... 328/152, 178/DIG. 15, 307/223 R, 328/103, 328/153, 325/464, 334/15

[51] Int. Cl. .......................................... H03k 17/00

[58] Field of Search .................... 328/103, 152, 153; 307/223 R, 320; 334/15; 325/464, 465, 470; 178/DIG. 15

[56] References Cited

UNITED STATES PATENTS

| | | | |
|---|---|---|---|
| 3,503,018 | 3/1970 | Cavanagh | 334/15 |
| 3,596,183 | 7/1971 | Spies | 334/15 X |
| 3,654,557 | 4/1972 | Sakamoto et al. | 325/465 |
| 3,746,886 | 7/1973 | Konopka | 334/15 X |

*Primary Examiner*—John Zazworsky
*Attorney, Agent, or Firm*—Lewis H. Eslinger, Esq.; Alvin Sinderbrand, Esq.

[57] ABSTRACT

A system for automatically skipping unused channels in tuning through a sequence of used and unused channels. The tuning means causes a tuning signal to be applied to the system to allow a free-running pulse generator to supply pulses to an actuator as long as the tuning signal continues to be supplied. The actuator enables each of a series of channel control means one at a time and in order, changing from one to the next at the occurrence of each pulse. In order to keep the tuning from stopping on an unused channel, all of the channel control means are connected to a skip control means that supplies its own signal to allow the pulse generator to continue supplying pulses as long as the enabled channel control means is for an unused channel. The skip control means can derive its actuating signal from the voltage supplied by an output potentiometer for each channel control means to supply voltage to a variable reactance element.

9 Claims, 10 Drawing Figures

UNUSED CHANNEL SKIP SYSTEM

BACKGROUND OF THE INVENTION

1. Field of the Invention

This invention relates to the field of channel skipping systems and particularly to systems for automatically tuning a television receiver through one or more unused channels to the next channel in use.

2. Prior Art

The remote tuning of a television receiver is usually accomplished by sending a signal from the remoteactuator to a transducer in the receiver. The transducer then applies the signal, in suitable electrical form, to a selecting device that steps the tuner from one channel setting to the next and the next and so on. The remote signal may be a supersonic wave, and it is a relatively simple matter to provide one supersonic frequency to tune from lower channels to higher channels and a different frequency to tune from higher channels to lower channels. In either case the same signal form would be used to tune, say, from channel 2 to channel 3 as from channel 12 to channel 13, for it would be quite expensive to provide means in the tuner to generate different signals for each channel.

It is not desirable to allow the tuner to stop on an unused channel, that is, a channel that is not used in the particular area where that receiver is located. The viewer would see nothing, or at least, nothing intelligible on the unused channel and might think that the set was broken. Therefore, receivers have been provided with means to allow the tuner to stop only on channels that are in use in that area. Such means have included switches that can be set or programmed, but the programming requires a degree of knowledge that is frequently beyond the viewer.

It is, therefore, an object of the present invention to provide an automatic system for skipping unused channels.

The tuning device for the receiver may include a voltage-controlled reactance with individual channel control means to apply different voltage levels to it to cause the tuner to be set to the individual channel frequencies in use in that area. The channel control means for unused channels would then be set to supply zero voltage, or some fixed limit voltage, to the tuner when those particular control means were enabled.

It is another object of the invention to utilize the output setting of the channel control means to derive a skip control voltage that has a first value, perhaps zero, for unused channels and at least a second value for each channel in use and to cause a stepping or counting device to continue channel by channel as long as the first value signal is produced by the enabled channel control means.

Other objects will be apparent from the following specification and the drawings.

SUMMARY OF THE INVENTION

The system of this invention is responsive to control signals that have one frequency to select progressively higher channels and another frequency to select progressively lower channels. These signals are separated into UP and DOWN paths by filters, but both paths feed signals to a control circuit that governs the operation of a self-repetitive pulse generator, such as a free-running multivibrator. The control circuit allows the generator to produce pulses as long as either an UP or a DOWN signal is being supplied.

The pulses are applied to a counting circuit which, in turn, causes channel control means to be enabled in stepped sequence to supply signals that activate each of the channels in turn. In the case of a television receiver the signals that activate the channels may be direct voltages applied to a voltage-controlled reactance that controls the television tuner. A different voltage would be supplied for each channel frequency.

If a channel is to be skipped because there are no stations broadcasting on that channel in the area in which that receiver is located, the voltage that could be used to adjust the reactance to cause the tuner to tune into that channel frequency can instead be made zero. Thus, the tuner would be supplied with reactance controlling voltages only for those channels that were active.

A skip control circuit is connected to all of the channel control circuits to be energized by whichever channel control circuit has been enabled at any given instant. If the enabled circuit is one that corresponds to an active channel, the skipped control circuit will receive a voltage other than zero. The exact magnitude of this voltage will depend upon the voltage level required to set the television tuner to that channel frequency. On the other hand, if the enabled channel circuit corresponds to a channel that is to be skipped, the skip control circuit will receive a zero voltage signal. The output of the skip control circuit is connected back to the control circuit for the pulse generator to cause that pulse generator to continue supplying pulses until the skip control circuit receives a signal other than zero. Thus, the unused channels are automatically skipped.

The system also includes a bistable circuit, such as a flip-flop, actuated by signals from the UP and DOWN paths to cause it to have one or the other of its two possible states of conductivity. This information is then conducted to the counting circuit to determine whether the counting will be up or down.

DESCRIPTION OF THE PREFERRED EMBODIMENTS

Figure 1:
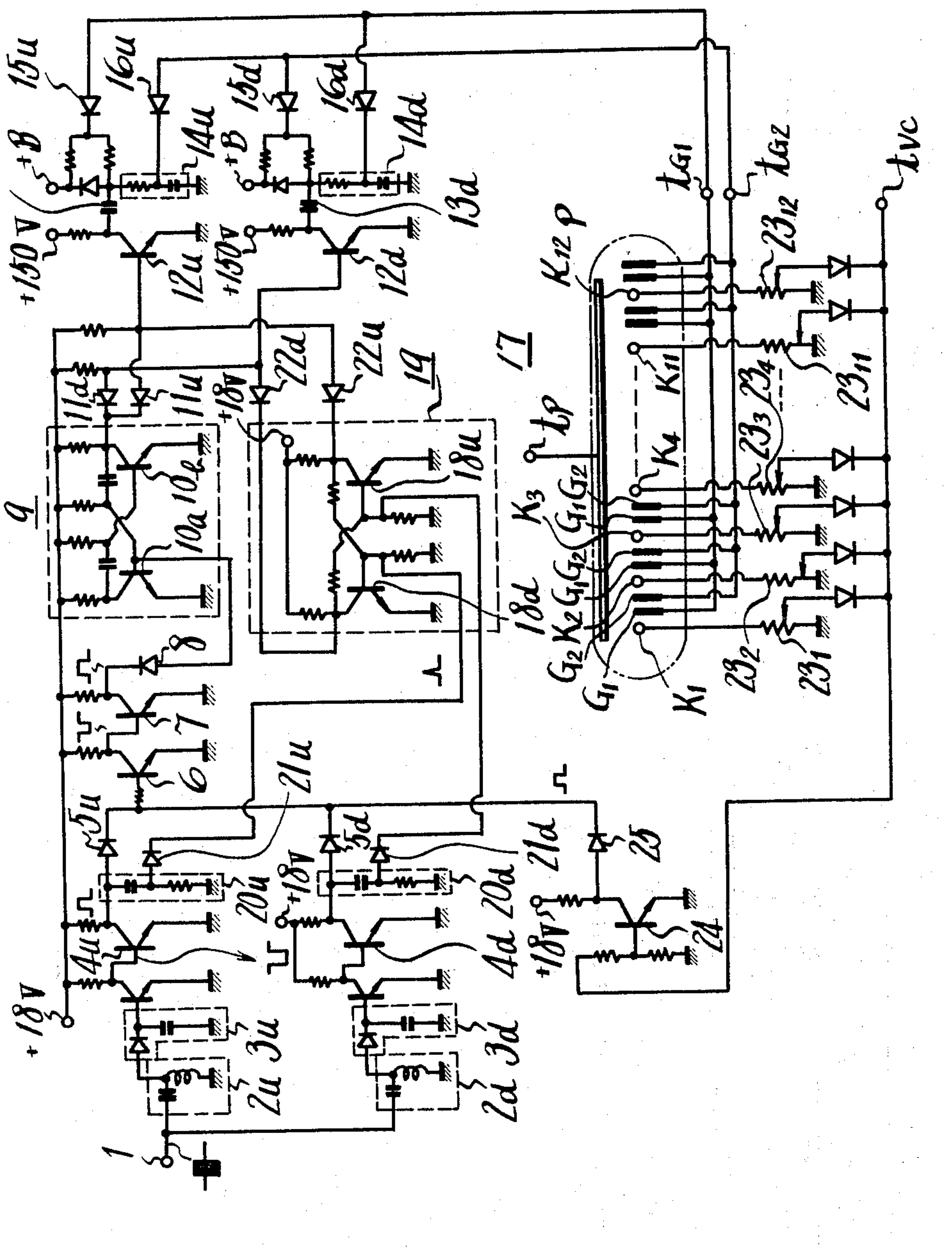
FIG. 1 is a schematic circuit diagram of one embodiment of this invention.

In FIG. 1 a tuning signal which is shown as a burst is applied to the input terminal 1. This signal may conveniently be derived from a transducer that responds to the usual ultrasonic remote control tuner and changes the ultrasonic wave into an electrical wave. This signal is applied to filter circuits 2u and 2d which are tuned, respectively, to the frequencies that cause the television tuner to change successively to higher or lower channels. The symbols *u* and *d* as used in this diagram refer to the components that are used in either the upward or downward channel change. In order to simplify the description of the system it will be assumed that the signal applied to the input terminal 1 is an UP signal.

The UP signal applied to the terminal 1 is passed through the filter 2u and rectified by a detector circuit 3u to produce an output signal that corresponds to the envelope of the burst that was applied to the terminal 1. The polarity of this signal is such that, after being amplified and inverted, it is applied to the base of a transistor 4u as a negative-going pulse. At the collector of the transistor 4u the pulse is a positive pulse and is fed through a diode 5u to the base of a transistor 6. This causes a negative pulse to be generated at the collector of the transistor 6 and applied to the base of a transistor 7 to cause the transistor 7 to become non-conductive. The transistor 7 is connected to control a normally free-running multivibrator 9 by being in series with a diode 8 between the base and emitter of a transistor 10a which, together with the transistor 10b, form the active elements of the multivibrator. In the absence of any tuning signal applied to the terminal 1, the transistor 7 is conductive and thus prevents the multivibrator 9 from producing pulses.

When a tuning signal is applied to the input terminal 1, and the transistor 7 is made non-conductive, the multivibrator 9 is free to begin its normal free-running operation. The time constants of the multivibrator are such that its pulse rate, which is the rate at which the television tuner is shifted from channel to channel, is slow enough to allow an operator to stop the tuning at any desired channel. The output pulse from the collector of the transistor **10*b* is supplied through a diode 11u to the base of the transistor 12u. When no tuning signal is applied to the input terminal 1, the transistor 10*b* is conductive and this keeps the transistor 12u non-conductive. On the other hand, when the tuning control signal is applied to the input terminal 1, the transistor 10*b* becomes non-conductive during the generation of a pulse from a multivibrator 9 and then conductive again at the end of each such pulse. This causes the transistor 12**u to become conductive for the duration of each of the pulses produced by the multivibrator.

The collector of the transistor 12u is connected to a relatively high voltage of approximately 150 volts so that when this transistor becomes conductive, a negative pulse is obtained through the capacitor 13u connected to the collector of the transistor 12u. The negative pulse is supplied with a suitable bias voltage +B to avoid incorrect glow-discharge in a counting tube 17 which will be described hereinafter. Each negative pulse through the capacitor 13u is applied to an integrating circuit 14u that, in effect, delays the pulse slightly. The undelayed pulse is applied through a diode 15u to a terminal $t_{G1}$ of the counting tube 17 while the slightly delayed pulse from the intergrating circuit 14u is applied through a diode 16u to a second terminal $t_{G2}$.

The glow discharge counting tube 17 has an anode connected to a source of voltage at a terminal $t_p$. Opposite the anode is a plurality of cathodes $K_1$–$K_{12}$ and between each pair of cathodes is a pair of guide electrodes $G_1$ and $G_2$. All of the electrodes $G_1$ are connected together to the terminal $t_{G1}$ and all of the guide electrodes G2 are connected to the other terminal $t_{G2}$. During operation of the apparatus there will, at any time, be a glow discharge between one of the cathodes $K_1$–$K_{12}$ and the anode. In order to transfer the discharge from that particular cathode to the next higher-numbered cathode, the guide electrodes $G_1$ are first supplied with negative pulses, and then the guide electrodes $G_2$ are supplied thereafter.

FIG. 1 also shows circuit means for causing the glow discharge to be switched in a descending order. Such circuit means include a filter **2*d* connected in parallel with the filter 2u to the input terminal 1. The filter 2*d* is tuned to the frequency of the DOWN tuning signal but is otherwise similar to the filter 2u. Connected to the output of the filter 2*d* is a rectifier 3*d* that feeds a pair of transistors connected in cascade. The second of these transistors is identified by the reference character 4*d* and the output at its collector is connected by way of a diode 5*d* to the base of the transistor 6. The diodes 5u and 5*d* form part of an OR circuit so that the transistors 6 and 7 are actuated in exactly the same way whether the signal is an UP signal or a DOWN signal. By the same token the multivibrator 9** is allowed to generate pulses in the same manner for both UP and DOWN counting.

Control of the supply of the multivibrator pulses to the counting tube 17 is accomplished by two transistors 18u and 18d connected in a flip-flop circuit 19. A pair of differentiating circuits 20u and **20*d* are connected to the outputs of the transistors 4u and 4*d*, respectively, to differentiate the rectangular waves at the collector of these transistors. The differentiated signals are connected by way of a pair of rectifiers 21u and 21d to the bases of the transistors in the flip-flop circuit 19 so that the latter transistors receive only the positive-going parts of the differentiated signals. The differentiating circuit 20u is connected to the transistor 18*d*** to make that transistor conductive when the channels are to be counted in the UP direction.

A diode **22*d* connects the common terminal between the diode 11d and the base of the transistor 12*d* to the collector of the transistor 18*d*. A corresponding diode 22u connects the common terminal between the diode 11u and the base of the transistor 12u to the collector of the transistor 18u. When an UP signal is applied to the terminal 1, the resulting differentiated signal applied to the base of the transistor 18*d* causes it to become conductive and prevents output pulses from the multivibrator 9 from actuating the base of the transistor 12*d*. On the other hand, since the transistor 18u is not conductive under this condition, pulses from the multivibrator 9 are directly applied to the base of the transistor 12u by way of the diode 11**u.

Conversely, when the channels are to be counted DOWN, an output signal is derived from the differentiating circuit **20*d* and applied to the base of the transistor 18u to make that transistor conductive. This causes the transistor 18*d* to be nonconductive and so makes it possible for pulses from the multivibrator 9 to pass through the base of the transistor 12d and actuate the latter. However, since the transistor 18u is conductive, pulses from the multivibrator are effectively prevented from actuating the transistor 12u. Thus, it may be seen that the existence of an UP signal applied to the terminal 1 allows the multivibrator pulses to actuate the transistor 12u and the existence of a DOWN signal at the terminal 1 allows the multivibrator pulses to actuate the transistor 12**d.

The output circuit of the transistor **12*d* is similar to that of the transistor 12u and includes an integrating circuit 14*d* and two diodes 15*d* and 16*d*. However, the diode 15*d* is connected to the terminal $t_{G2}$ and the diode 16d is connected to the terminal $t_{G1}$, which is exactly the reverse of the output connections of the diodes 15u and 16u. Because of this reversal of connections, the DOWN counting signal applied to the terminal 1 will cause the pulse from the multivibrator 9 to be applied to the terminal $t_{G2}$ slightly ahead of the time that the delayed pulse applied to the terminal $t_{G1}$. As stated previously, this will cause the glow discharge to shift from a given cathode in a group of cathodes $K_1$–$K_{12}$ to a cathode of the next lower number in the counting tube 17.**

The counting tube 17 is referred to as a double pulse tube because of the necessity of applying two pulses to transfer the glow discharge from one cathode to the next. Each of the cathodes is connected to ground by its own potentiometer $\mathbf{23}_1$, $\mathbf{23}_2$, ... $\mathbf{23}_{12}$ which serves as an impedance element. The cathodes, and these potentiometers, correspond to the channels 2–13, but it should be understood that they may be numbered differently or more channels may be provided for other uses.

The sliding contact of each potentiometer is set so that it derives a voltage of the proper value to tune the television set tuner. This tuning is accomplished by connecting all of the potentiometer arms through individual diodes to a tuning terminal $t_{VC}$. This terminal, in turn, is connected to a voltage-controlled variable reactance element, such as a variable capacitance diode, of an electronic tuning circuit. If all of the channels were in use, the arm of each of the potentiometers $\mathbf{23}_1$–$\mathbf{23}_{12}$ would be set to some value above ground and not exceeding the maximum value available at the cathode end of the potentiometer. However, because of interference problems, channels in continuous frequency bands are not used in the same locality. Thus, in New York City, channels 2, 4, 5, 7, 9, 11 and 13 are used but channels 4 and 5 are separated by several megaherz. Sets located in an area where they would receive only signals from N.Y. stations would not need to be adjusted to pick up channels 3, 6, 8, 10 and 12. The arms of the potentiometers $\mathbf{23}_1$–$\mathbf{23}_{12}$ that would otherwise be expected to be tuned to the latter channels could, instead, be set at their lowest value, which, in the circuit shown is ground.

The voltage at the terminal $t_{VC}$ is also connected to a skip control circuit that includes a voltage divider through which signals are connected from the terminal $t_{VC}$ to the base of a transistor 24. This transistor is a switching transistor and is non-conductive when the glow discharge in the tube 17 is between the anode and one of the cathodes that corresponds to an unused television channel. That is, the voltage applied to the base of the transistor 24 is zero when the glow discharge tube 17 enables a channel, represented by one of the potentiometers $\mathbf{23}_1$–$\mathbf{23}_{12}$, that corresponds to an unused channel. On the other hand, since the transistor 24 is a switching type, it is made conductive whenever the voltage of the terminal $t_{VC}$ is sufficient to tune any of the channels. The collector of the transistor 24 is connected by way of a diode 25 to the base of the transistor 6. This diode 25 is another part of the OR circuit that includes the diodes 5u and 5d, and thus the transistor 6 is made conductive when any one of the transistors 4u or 4d or 24 is non-conductive.

Figure 2A:
FIGS. 2A – 2H are waveform diagrams showing different waveforms produced in different portions of the system of this invention as shown in FIG. 1.
Figure 2B:
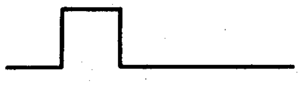
Figure 2C:

The operation of the invention as embodied in FIG. 1 will be explained with reference to the waveforms shown in FIGS. 2A–2H. It will be assumed that the tuning is an UP tuning. When the tuning signal as shown in FIG. 2A is applied to the input terminal 1, it passes through the filter 2u and is rectified by the rectifier 3u to produce an output signal shown in FIG. 2B. After amplification and inversion, this signal is applied to the base of the transistor 4u to cause that transistor to become non-conductive and to provide a positive-going signal at its collector. This signal is applied by way of diode 5u to the base of the transistor 6, causing that transistor to become conductive and causing the voltage at its collector to drop. This, in turn, makes the transistor 7 non-conductive and produces at its collector a positive-going voltage of the type shown in FIG. 2C. When the transistor 7 becomes non-conductive, the multivibrator 9 is no longer prevented from operating and therefore begins to produce pulses.

Figure 2D:
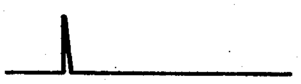
Figure 2E:
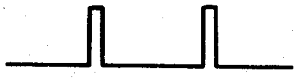

At the same time, the leading edge of the positive-going pulse at the collector of the transistor 4u is differentiated by the differentiating circuit 20u, and only the positive-going leading edge passes through the diode 21u as shown in FIG. 2D and is applied to the base of the transistor 18d to cause that transistor to become conductive. This, in turn, causes the common terminal between the diode 11*d* and the base of the transistor 12*d* to be connected effectively to ground by way of the diode 22*d* and the emitter-collector circuit of the transistor 18*d*. Thus, pulses from the multivibrator 9, which are shown in FIG. 2E, are prevented from actuating the transistor 12*d* but are allowed to actuate the transistor 12u.

Figure 2F:
Figure 2G:
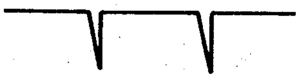
Figure 2H:
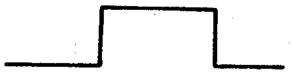

The output pulses of the transistor 12u that pass through the diode 15u are illustrated in FIG. 2F. These same pulses are briefly delayed by the integrating circuit 14u and are transmitted to the diode 16u in the form shown in FIG. 2G. Since the pulses in FIG. 2G are slightly delayed with respect to the pulses 2F and are applied to the terminal $t_{G2}$ of the counting tube 17 slightly after the pulses from the diode 15u are applied to the terminal $t_{G1}$, each pair of pulses from the diodes 15u and 16u causes the glow discharge in the counting tube 17 to move the glow discharge from one of the cathodes, for example, cathode $K_1$, to the next adjacent cathode, which in this case would be cathode $K_2$.

As shown in the drawing, the potentiometer $\mathbf{23}_2$ that is enabled by having the glow discharge passed to the cathode $K_2$ is associated with an unused channel. This is indicated by the fact that the arm of the potentiometer $\mathbf{23}_2$ is at the ground end. Thus, as soon as the glow discharge is transferred away from the cathode $K_1$, the transistor 24 becomes non-conductive and keeps the transistor 6 in its conductive state. This keeps the transistor 7 non-conductive and allows the multivibrator 9 to produce a second pulse as shown in FIG. 2E. This second pulse is operated on by the transistor 12u and the output circuit attached thereto, and the resulting direct and delayed pulses are transmitted through the diodes 15u and 16u in the proper order to cause the glow discharge to be transferred to the third cathode $K_3$. The potentiometer $\mathbf{23}_3$ connected to the cathode $K_3$ has its arm set at a value above ground level so that a positive voltage is supplied to the base of the transistor 24 to cause the latter to become conductive. This causes the voltage at the collector of the transistor 24 to drop, forming the trailing edge of the rectangular signal shown in FIG. 2H. Unless the tuning signal applied to the input terminal 1 continues past this point in time, the transistor 6 will become non-conductive and therefore the transistor 7 will again become conductive which will cause the multivibrator 9 to stop its free-running operation. This means that the counting operation of the tube 17 will stop as soon as a channel is enabled that has the arm of the respective potentiometer set above ground level. The counting will not be started again until another input signal is applied to the terminal 1.

Figure 3:
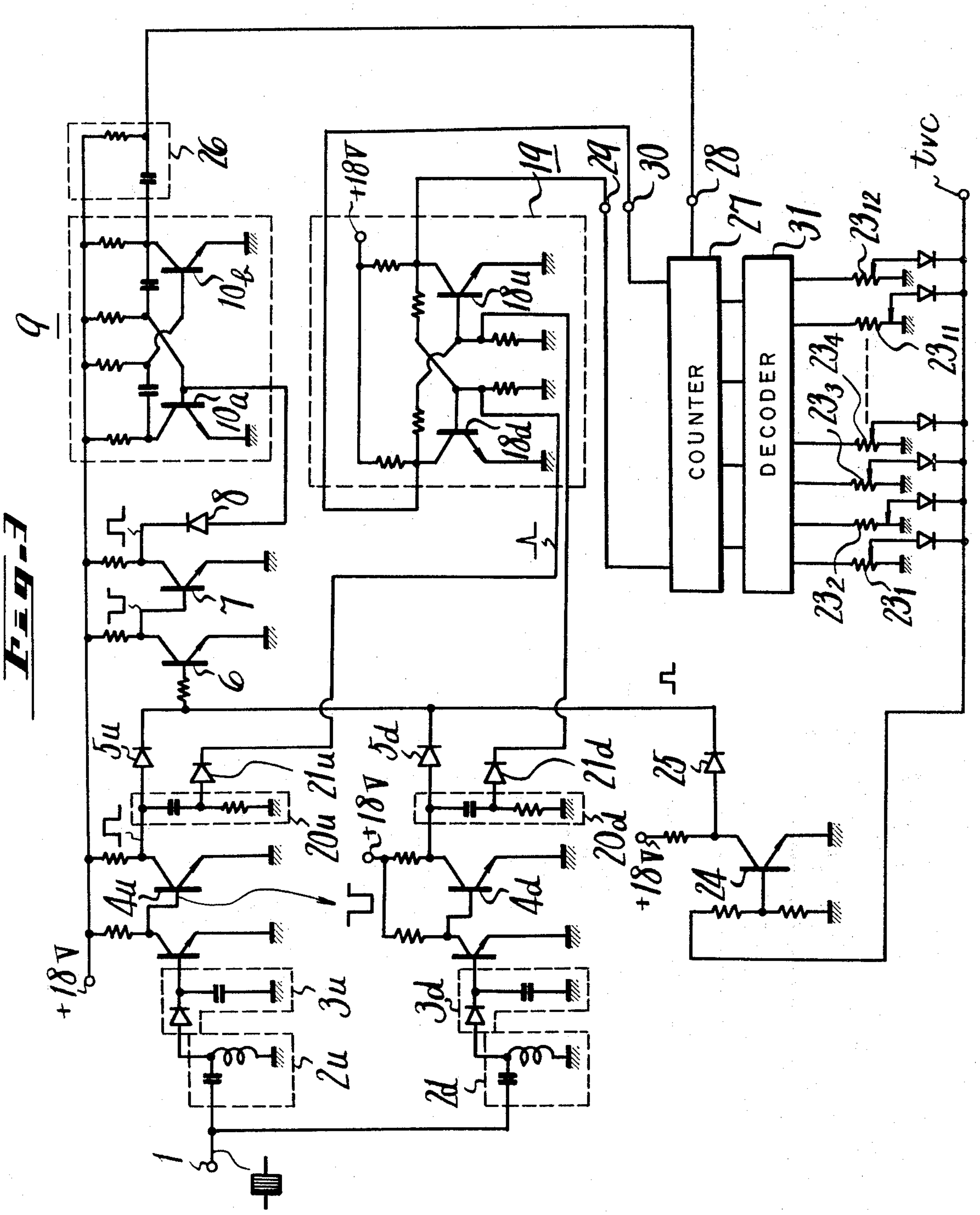
FIG. 3 is a schematic circuit diagram showing another embodiment of the invention.

FIG. 3 is another circuit for providing channel skipping and it uses part of the circuit elements of the system shown in FIG. 1. Those circuit elements are identified by the same reference numerals and their operation will not be described again.

The output of the multivibrator 9 is connected to a differentiating circuit 26 and from there to a trigger signal input terminal 28 of the counter 27. This counter is a duodecimal reversible type that consists of four flip-flops. It has two other input terminals 29 and 30 which direct the counting operation either UP or DOWN, respectively. The four output terminals of the flip-flop counter 27 are connected to the input terminals of a decoder 31 which functions in such a way as to enable each of the potentiometers $23_1$–$23_{12}$ in turn. Thus, each time a differentiated pulse from the multivibrator 9 is applied to the input terminal 28, the counter 27, operating through the decoder 31, enables a different one of the potentiometers 23 that form the channel control means.

Whether the newly enabled channel control means corresponds to a higher channel or a lower channel depends on whether the terminal 29 or the terminal 30 has a suitable voltage applied to it. This suitable voltage is the output voltage of the flip-flop 19. A high voltage is applied to the terminal 29 and a corresponding low voltage is applied to the terminal 30 when the transistor 18d is made conductive by receiving a signal from the differentiating circuit 20u indicating that the counter 27 is to count UP. The reverse condition of the flip-flop 19 causes the counter 27 to count DOWN.

In the present invention, all that is required to skip an unused channel is move the sliding contact of the relevant potentiometer 23 to ground. Thus, it is unnecessary to provide an independent switch for programming the channel skipping operation, and it is easy to program the skipping of an unused channel from outside of the television set.

While the system has been described as providing for channel skipping when the arm of a potentiometer is set at zero level, skipping may also be achieved by arranging so that the arm of the potentiometer is shifted to the other end of its range of travel. What is essential is that there be clear distinction between a potentiometer, or channel control means, that is set to cause the television tuner to adjust to one of the channel frequencies on a potentiometer that is set to cause the television tuner to be tuned beyond the range of channel frequencies.

It is also possible to cause the time constants of the multivibrator 9 to be varied so that a channel may be skipped in less time then it takes to shift from a used channel to another used channel.

In addition, instead of the detected ultrasonic signal to supply the signal to the terminal 1, a push button switch on the receiver itself may be used to actuate means to supply the input signal to the terminal 1.

What is claimed is:

1. A channel skip system comprising:

A. a plurality of channel control means each comprising an output settable to a first condition for a channel to be skipped or to a second condition for a channel not to be skipped;

B. actuating means connected to said control means to actuate each of said control means one after another in response to successive pulses;

C. a self-repetitive pulse generator connected to supply said pulses to said actuating means; and D. generator control means having an enabling state and a disabling state and connected to allow the supply of said pulses to said actuating means only when said generator control means is in its enabling state, said generator control means comprising:

1. means responsive to a tuning signal to place said generator control means in its enabling state for the duration of said tuning signal, and
2. skip control means connected to all of said channel control means to retain said generator control means in its enabling state as long as an actuated one of said channel control means is in its first condition.

2. The channel skip system of claim 1 in which each said channel control means comprises an output potentiometer, the arm of which comprises said output settable to one level for a channel to be skipped and settable to at least a second level for a channel not to be skipped.

3. The channel skip system of claim 1 in which said actuating means comprises a cold cathode counting tube.

4. The channel skip system of claim 1 in which said actuating means comprises flip-flop counting circuits and a decoder.

5. The channel skip system of claim 1 in which said skip control means comprises a switching transistor having an input circuit connected to said channel control means and an output circuit connected to said pulse generator to enable said generator to continue to produce pulses as long as said actuated channel control means is in its first condition.

6. The channel skip system of claim 1 in which said generator is a normally free-running generator and said generator control means inhibits the free-running of said generator except when said generator control means is in its enabling state.

7. The channel skip system of claim 1 in which said actuating means comprises steering means to actuate said channel control means in increasing or decreasing order in response to the tuning signal, and the operation of said skip control means is independent of the order of actuation of said channel means.

8. The channel skip system of claim 7 in which said actuating means comprises counting means to count each pulse produced by said generator and said steering means comprises:

A. a bistable circuit controlled by said tuning signal to have one output signal in response to an UP tuning signal and an alternative output signal in response to a DOWN tuning signal and B. means connecting said bistable circuit to said counting means to cause said counting means to actuate said channel control means in increasing order in response to said UP tuning signal and to actuate said counting means in decreasing order in response to said DOWN signal.

9. The channel skip system of claim 1 in which said tuning signal has a first identity when said actuating means is to actuate said channel control means in increasing order, and a second identity when said actuation means is to actuate said channel control means in decreasing order, said means responsive to said tuning signal comprising:

A. first and second responsive circuits responsive, respectively, to said first and second identities; and B. an OR circuit comprising first and second input circuits connected to said first and second responsive circuits, respectively, and a third input circuit connected to said skip control means to receive signals therefrom and connected to said pulse generator to allow said pulse generator to generate pulses as long as any one of said first, second, or third input circuits of said OR circuit receives a signal.

* * * * *